United States Patent
Zhang et al.

(10) Patent No.: US 11,713,507 B2
(45) Date of Patent: Aug. 1, 2023

(54) LOW-K FILMS

(71) Applicant: Applied Materials, Inc., Santa Clara, CA (US)

(72) Inventors: Shuaidi Zhang, San Jose, CA (US); Ning Li, San Jose, CA (US); Mihaela A. Balseanu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/840,797

(22) Filed: Jun. 15, 2022

(65) Prior Publication Data

US 2022/0307134 A1    Sep. 29, 2022

Related U.S. Application Data

(62) Division of application No. 16/897,490, filed on Jun. 10, 2020, now Pat. No. 11,371,144.

(51) Int. Cl.
*H01L 21/02* (2006.01)
*H01L 29/78* (2006.01)
(Continued)

(52) U.S. Cl.
CPC ........ *C23C 16/45553* (2013.01); *C23C 16/36* (2013.01); *C23C 16/45542* (2013.01);
(Continued)

(58) Field of Classification Search
None
See application file for complete search history.

(56) References Cited

U.S. PATENT DOCUMENTS 7,259,105 B2    8/2007  Kim
2014/0287597 A1  9/2014  Hirose et al.
(Continued)

FOREIGN PATENT DOCUMENTS

WO    2006101856 A2    9/2006

OTHER PUBLICATIONS

Park et al., "Surface Analysis of TMCTS-Based SiOC(H) Low-k Dielectrics in Post-Etch Strip of ACL Hardmask", Materials (Basel), Feb. 28, 2021;14(5):1144. (Year: 2021).*
(Continued)

*Primary Examiner* — Asok K Sarkar
(74) *Attorney, Agent, or Firm* — Servilla Whitney LLC

(57) ABSTRACT

Methods for plasma enhanced atomic layer deposition (PEALD) of low-κ films are described. A method of depositing a film comprises exposing a substrate to a silicon precursor having the general formula (I)

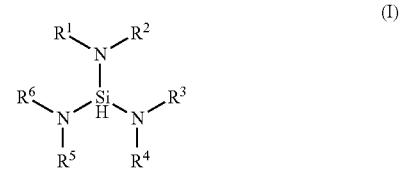

wherein $R^1$, $R^2$, $R^3$, $R^4$, $R^5$, and $R^6$ are independently selected from hydrogen (H), substituted alkyl, or unsubstituted alkyl; purging the processing chamber of the silicon precursor; exposing the substrate to a carbon monoxide (CO) plasma to form one or more of a silicon oxycarbide (SiOC) or silicon oxycarbonitride (SiOCN) film on the substrate; and purging the processing chamber.

7 Claims, 2 Drawing Sheets

(51) Int. Cl.
　　　C23C 16/455　　　(2006.01)
　　　C23C 16/36　　　(2006.01)
(52) U.S. Cl.
　　　CPC .... *H01L 21/0228* (2013.01); *H01L 21/02126* (2013.01); *H01L 21/02219* (2013.01); *H01L 21/02274* (2013.01); *H01L 29/78* (2013.01)

(56) References Cited

U.S. PATENT DOCUMENTS

| | | |
|---|---|---|
| 2020/0270749 A1 | 8/2020 | Li et al. |
| 2021/0017648 A1 | 1/2021 | Kubota et al. |
| 2021/0066472 A1* | 3/2021 | Wu .................. H01L 29/78621 |

OTHER PUBLICATIONS

"Challenges in atomic layer deposition of carbon-containing silicon-based dielectrics", J. Vac. Sci. Technol. A 35, 021506 (2017); https://doi.org/10.1116/1.4973923, Jan. 12, 2017.

* cited by examiner

LOW-K FILMS

CROSS-REFERENCE TO RELATED APPLICATIONS

This application is a Divisional of and claims priority to U.S. application Ser. No. 16/897,490, filed Jun. 10, 2020, the entire disclosure of which is hereby incorporated by reference herein.

TECHNICAL FIELD

Embodiments of the present disclosure pertain to the field of electronic device manufacturing, and in particular, to integrated circuit (IC) manufacturing. More particularly, embodiments of the disclosure provide methods of depositing low-κ films.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

Atomic Layer Deposition (ALD) and Plasma-Enhanced ALD (PEALD) are deposition techniques that offer control of film thickness and conformality. Most ALD processes are based on binary reaction sequences, where each of the two surface reactions occurs sequentially. Because the surface reactions are sequential, the two gas phase reactants are not in contact, and possible gas phase reactions that may form and deposit particles are limited. Due to continuously decreasing device dimensions in the semiconductor industry, there is increasing interest and applications that use ALD/PEALD.

Atomic layer deposition (ALD) of silicon oxycarbide (SiOC) silicon oxycarbonitride (SiCON) is challenging due to stringent requirements such as high conformality, low etch rate, low k, high ashing resistance, and the like. Currently, silicon nitride (SiN) films are used for front end of the line (FEOL) dielectric applications, such as gate spacers. The high dielectric constant (about 7) of silicon nitride (SiN) induces large parasitic capacitance in the device. Yet, current low-k dielectrics cannot survive FEOL processing.

Accordingly, films and methods of producing films with lower k than SiN and that can survive FEOL processes are needed.

SUMMARY

Methods to manufacture integrated circuits are described. In one or more embodiments, a method of depositing a film on a substrate is described. The method comprises: exposing a substrate in a processing chamber to a silicon precursor having the general formula (I)

(I)

wherein $R^1$, $R^2$, $R^3$, $R^4$, $R^5$, and $R^6$ are independently selected from hydrogen (H), substituted alkyl or unsubstituted alkyl; purging the processing chamber of the silicon precursor; exposing the substrate to a carbon monoxide (CO) plasma to form one or more of a silicon oxycarbide (SiOC) or silicon oxycarbonitride (SiOCN) film on the substrate; and purging the processing chamber.

One or more embodiments are directed to an electronic device. In one or more embodiments, an electronic device comprises: a gate stack having a first side and a second side; a source material; a drain material; and a spacer material on the first side and on the second side of the gate stack, the spacer material comprising one or more of a silicon oxycarbide (SiOC) film and a silicon oxycarbonitride (SiOCN) film, the silicon oxycarbide (SiOC) film and the silicon oxycarbonitride (SiOCN) film substantially free of amorphous carbon.

One or more embodiments are directed to a non-transitory computer readable medium including instructions, that, when executed by a controller of a processing chamber, causes the processing chamber to perform operations of: flow a silicon precursor into a processing volume of a processing chamber having a substrate, the silicon precursor having the general formula (I)

(I)

wherein $R^1$, $R^2$, $R^3$, $R^4$, $R^5$, and $R^6$ are independently selected from hydrogen (H), substituted alkyl, or unsubstituted alkyl; purge the processing chamber of the silicon precursor; expose the substrate to a carbon monoxide (CO) plasma; and purge the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

As used in this specification and the appended claims, the terms "precursor", "reactant", "reactive gas" and the like are used interchangeably to refer to any gaseous species that can react with the substrate surface.

In one or more embodiments, provided is a plasma enhanced atomic layer deposition (PEALD) process for forming low-κ films, e.g. spacer films, using alkylaminosilane precursors and carbon monoxide (CO) plasma. In one or more embodiments, the film, e.g. silicon oxycarbonnitride (SiCON) and/or silicon oxycarbide (SiOC), that forms contains carbon and can advantageously withstand ashing and reactive ion etching (REI).

In one or more embodiments, a low-k film is deposited on a substrate. The low-k film of one or more embodiments, advantageously has a wet etch rate (WER) in range of about 0.5 Å/min to about 2 Å/min in hydrofluoric acid (1:100 HF), including about 0.5 Å/min, about 0.75 Å/min, about 1.0 Å/min, about 1.25 Å/min, about 1.5 Å/min, about 1.75 Å/min, or about 2.0 Å/min. The low-k film of one or more embodiments advantageously has high ashing resistance. In one or more embodiments, the post ashing WER in 100:1 HF ranges from about 10 Å/min to about 20 Å/min, with even lower values should a significant amount of Si—C bond or structured amorphous carbon layer be involved. By comparison, in one or more embodiments, post ashing silicon nitride deposited at the same temperature has a WER of about 14 Å/min. In one or more embodiments, the low-k film has a dielectric constant or extinction coefficient or k-value in a range of about 2.0 to about 6.0, including about 2.25, about 2.5, about 2.75, about 3.0, about 3.25, about 3.5, about 3.75, about 4.0, about 4.25, about 4.5, about 4.75, about 5.0, about 5.25, about 5.5, about 5.75, or about 6.0.

In one or more embodiments, the density of the low-κ film is in a range of greater than about 2.1 g/cc, including greater than about 2.15 g/cc, greater than about 2.2 g/cc, greater than about 2.25 g/cc, greater than about 2.3 g/cc, greater than about 2.35 g/cc, greater than about 2.4 g/cc, or greater than about 2.5 g/cc.

Without intending to be by bound by theory, it is thought that depositing silicon oxycarbide (SiOC) and/or silicon oxycarbonitride (SiCO(N)) films is challenging due to low reactivity when incorporating carbon (C). In one or more embodiments, the use of silicon-containing precursors of general formula (I) in combination with carbon monoxide (CO) plasma advantageously aids in retaining more carbon (C) in the deposited film.

Carbon monoxide (CO) plasma is a reducing plasma with carbon content. Carbon dioxide ($CO_2$) plasma is an oxidizing plasma with carbon content. In one or more embodiments, carbon monoxide plasma provides higher growth per cycle (GPC) and better film electrical properties. As used herein, the term "growth per cycle" or "GPC" refers to the amount of film thickness growth per ALD cycle (unit: Å/cycle). For this chemistry, the value is in a range of about 0.03 Å/cycle to about 0.8 Å/cycle depending on processing conditions. As recognized by one of skill in the art, this is an average value, GPC of about 0.03 Å/cycle does not literally mean 0.03 Å of uniform film is deposited per cycle (as Si—C, Si—O, C—O bond is on the scale of about 1 Å). Instead, it means an incomplete monolayer deposition. In current processes for forming films of SiCON, the percentage of carbon is not tunable. In one or more embodiments, using carbon monoxide (CO) plasma advantageously permits tunability of the percentage C (C %) in the film through changes in one or more of plasma power, plasma exposure time, CO/Ar ratio, and RF frequency.

Using a carbon monoxide (CO) plasma by itself will lead to the deposition of an amorphous carbon film, permitting structured films to be made, for example bilayer SiOx/a-C film that has both excellent electrical properties and WER resistance. In one or more embodiments, combining a carbon monoxide plasma with an alkylamino silane precursor results in a silicon oxycarbide (SiOC) and/or silicon oxycarbonitride (SiCON) film that is substantially free of amorphous carbon. As used herein, the term "substantially free" means that there is less than 5%, including less than 4%, less than 3%, less than 2%, less than 1%, and less than 0.5% of amorphous carbon in the film.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In one or more embodiments, the purge gas is selected from one or more of argon (Ar), nitrogen ($N_2$), or helium (He). In one or more embodiments, the same purge gas is used to purge the precursor and the reductant. In other embodiments, a different purge gas is used to purge the processing chamber of the precursor than the purge gas used to purge the processing chamber of the reductant.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In one or more embodiments, the films described herein may be formed by plasma enhanced atomic layer deposition (PEALD) processes using a silicon precursor including one or more precursor having the general formula (I)

(I)

wherein $R^1$, $R^2$, $R^3$, $R^4$, $R^5$, and $R^6$ are independently selected from hydrogen (H), substituted alkyl, or unsubstituted alkyl, and a carbon monoxide (CO) plasma.

In one or more embodiments, at least one of $R^1$, $R^2$, $R^3$, $R^4$, $R^5$, and $R^6$ is methyl or ethyl. In one or more embodiments, the alkylaminosilane comprises tris(dimethylamino)silane or bis(diethylamino)silane.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

In one or more embodiments, the deposition process may be carried out at temperatures ranging from about 200° C. to about 700° C., including about 225° C., about 250° C., about 275° C., about 300° C., about 325° C., about 350° C., about 375° C., about 400° C., about 425° C., about 450° C., about 475° C., about 500° C., about 525° C., about 550° C., about 575° C., about 600° C., about 625° C., about 650° C., about 675° C., and about 700° C.

The deposition process may be carried out in a process volume at pressures ranging from 0.1 mTorr to 100 Torr, including a pressure of about 0.1 mTorr, about 1 mTorr, about 10 mTorr, about 100 mTorr, about 500 mTorr, about 1 Torr, about 2 Torr, about 3 Torr, about 4 Torr, about 5 Torr, about 6 Torr, about 7 Torr, about 8 Torr, about 9 Torr, about 10 Torr, about 20 Torr, about 30 Torr, about 40 Torr, about 50 Torr, about 60 Torr, about 70 Torr, about 80 Torr, about 90 Torr, and about 100 Torr.

In one or more embodiments, the silicon precursor is flowed into the processing chamber as a gas. In one or more embodiments, the precursor-containing gas further includes one or more of a dilution gas selected from helium (He), argon (Ar), xenon (Xe), krypton (Kr), nitrogen ($N_2$), or hydrogen ($H_2$). The dilution gas of some embodiments comprises a compound that is inert gas relative to the reactants and substrate materials.

In one or more embodiments, the low-κ dielectric film may be deposited to a thickness greater than about 0.1 nm. In other embodiments, the low-κ dielectric film may be deposited to a thickness in a range of about 0.1 nm to about 25 nm, or about 0.5 nm to about 25 nm, including about 0.1 nm, about 0.5 nm, about 1.0 nm, about 1.5 nm, about 2.0 nm, about 2.5 nm, about 3.0 nm, about 3.5 nm, about 4.0 nm, about 4.5 nm, about 5.0 nm, about 5.5 nm, about 6.0 nm, about 6.5 nm, about 7.0 nm, about 7.5 nm, about 8.0 nm, about 8.5 nm, about 9.0 nm, about 9.5 nm, about 10.0 nm, about 11.0 nm, about 12.0 nm, about 13.0 nm, about 14.0 nm, about 15.0 nm, about 16.0 nm, about 17.0 nm, about 18.0 nm, about 19.0 nm, about 20.0 nm, about 21.0 nm, about 22.0 nm, about 23.0 nm, about 24.0 nm, and about 25.0 nm.

In one or more embodiments, the density of the low-κ film is greater than about 2.1 g/cc.

Figure 1:
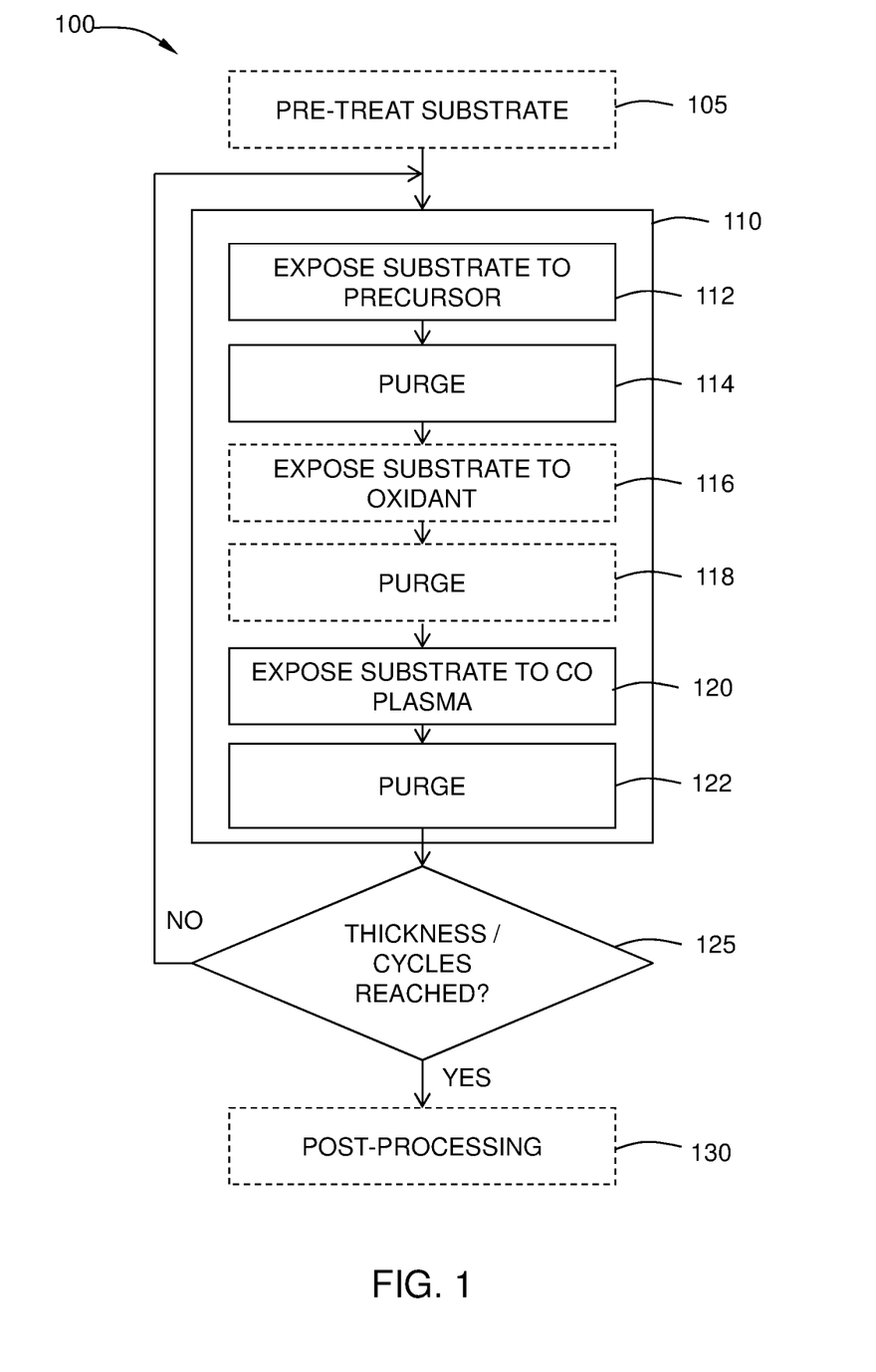
FIG. 1 depicts a flow diagram of a method for forming a low-κ film on a substrate in accordance with one or more embodiments.

With reference to FIG. 1, one or more embodiments of the disclosure are directed to method 100 of depositing a thin film. The method illustrated in FIG. 1 is representative of plasma enhanced atomic layer deposition (PEALD) process in which the substrate or substrate surface is exposed sequentially to the reactive gases in a manner that prevents or minimizes gas phase reactions of the reactive gases.

In some embodiments, the method 100 includes a pre-treatment operation 105. The pre-treatment can be any suitable pre-treatment known to the skilled artisan. Suitable pre-treatments include, but are not limited to, pre-heating, cleaning, soaking, native oxide removal, and the like. In one or more embodiments, a nitrogen ($N_2$) plasma is used to nitridize the native oxide into silicon nitride, helping with initial nucleation.

At deposition operation 110, a process is performed to deposit a silicon-containing thin film on the substrate (or substrate surface). The deposition process can include one or more operations to form a film on the substrate. In operation 112, the substrate (or substrate surface) is exposed to a silicon precursor to deposit a film on the substrate (or substrate surface). In one or more embodiments, the silicon precursor is any silicon precursor of general formula (I)

wherein $R^1$, $R^2$, $R^3$, $R^4$, $R^5$, and $R^6$ are independently selected from hydrogen (H), substituted alkyl, or unsubstituted alkyl, that can react with (i.e., adsorb or chemisorb onto) the substrate surface to leave a silicon-containing species on the substrate surface.

In one or more embodiments, the substrate (or substrate surface) can be any suitable surface. Suitable surfaces include, but are not limited to, silicon (Si), silicon dioxide ($SiO_2$), silicon oxide ($SiO_x$), silicon nitride (SiN), silicon carbide (SiC), silicon oxycarbide (SiOC), platinum (Pt), titanium nitride (TiN), tantalum nitride (TaN), copper (Cu), cobalt (Cu), tungsten (W), ruthenium (Ru), molybdenum (Mo) or combinations thereof.

At operation 114, the processing chamber is purged to remove unreacted silicon precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the silicon precursor by any suitable technique including, but not limited to, moving the substrate through a gas curtain to a portion or sector of the processing chamber that contains none or substantially none of the silicon precursor. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur.

At operation 116, the substrate (or substrate surface) is optionally exposed to an oxidizing agent (or oxidant) to chemisorb onto the alkylamino group terminated substrate surface. In one or more embodiments, the oxidizing agent may comprises a mild organic oxidant such as, but not limited to, an ether, an aldehyde, an alcohol, a ketone, a carboxylic acid, or an epoxide.

At operation 118, the processing chamber is purged after exposure to the oxidizing agent. Purging the processing chamber in operation 118 can be the same process or different process than the purge in operation 114. Purging the processing chamber, portion of the processing chamber, area adjacent the substrate surface, etc., removes unreacted oxidizing agent, reaction products and by-products from the area adjacent the substrate surface.

In one or more embodiments, the deposition process comprises a plasma enhanced atomic layer deposition process (PEALD). Accordingly, after exposure to the alkylaminosilane precursor, the substrate is exposed to a plasma at operation 120. In one or more embodiments, the plasma is a carbon monoxide (CO) plasma. In one or more embodiments, without intending to be bound by theory, it is thought that introducing a carbon monoxide (CO) plasma facilitates the reaction between previous bilayers or oxidizes the alkylaminosilane by itself.

In one or more embodiments, the carbon monoxide (CO) plasma may optionally be coflowed with a diluent gas. The dilution gas of some embodiments comprises a compound that is inert gas relative to the reactants and substrate materials. In one or more embodiments, the dilution gas may comprise a noble gas. In specific embodiments, the dilution gas may comprise one or more of helium (He), neon (Ne), argon (Ar), krypton (Kr), and xenon (Xe).

In some embodiments, the carbon monoxide (CO) plasma is combined with an argon (Ar) plasma. The carbon monoxide (CO) plasma and the argon (Ar) plasma may be combined in a ratio of about 100:0 to about 10:90, including a ratio of about 90:10.

In one or more embodiment, the percentage of carbon (C %) in the deposited film is controlled by the plasma exposure time (1 or 2 RPM), CO concentration, and RF power.

In one or more embodiments, exposing the substrate to a carbon monoxide plasma in the chamber forms a film of silicon oxycarbide (SiOC) or silicon oxycarbonitride (SiOCN) on the substrate. In some embodiments, the carbon monoxide plasma is a remote plasma. In other embodiments, the carbon monoxide plasma is a direct plasma.

In one or more embodiments, the carbon monoxide plasma may be generated remotely or within the processing chamber. In one or more embodiments, the carbon monoxide plasma is an inductively coupled plasma (ICP) or a conductively coupled plasma (CCP). Any suitable power can be used depending on, for example, the reactants, how the plasma is coupled to the chamber (ICP or CCP), generator RF frequency, or the other process conditions. In some embodiments, the carbon monoxide plasma is generated with a plasma power in the range of about 10 W to about 300 W. In some embodiments, the plasma is generated with a plasma power less than or equal to about 300 W, less than or equal to about 200 W, less than or equal to about 100 W, less than or equal to about 50 W, or less than or equal to about 25 W.

At operation 122, the processing chamber is purged after exposure to the carbon monoxide plasma. Purging the processing chamber in operation 122 can be the same process or different process than the purge in operation 114 and/or operation 118. Purging the processing chamber, portion of the processing chamber, area adjacent the substrate surface, etc., removes carbon monoxide plasma, reaction products and by-products from the area adjacent the substrate surface.

At decision 125, the thickness of the deposited film, or number of cycles of silicon-precursor and carbon monoxide plasma is considered. If the deposited film has reached a predetermined thickness or a predetermined number of process cycles have been performed, the method 100 moves to a post-processing operation 130. If the thickness of the deposited film or the number of process cycles has not reached the predetermined threshold, the method 100 returns to deposition operation 110 to expose the substrate surface to the alkylaminosilane precursor again in operation 112, and continuing.

The post-processing operation 130 can be, for example, a process to modify film properties (e.g., annealing or densification) or a further film deposition process (e.g., additional ALD or CVD processes) to grow additional films. In some embodiments, the post-processing operation 130 can be a process that modifies a property of the deposited film. In some embodiments, the post-processing operation 130 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the dielectric constant and/or increases the purity of the film. In one or more embodiments, increase in breakdown voltage and decreases in leakage current occur.

The method 100 can be performed at any suitable temperature depending on, for example, the silicon precursor, oxidizing agent, carbon monoxide plasma, or thermal budget of the device. In some embodiments, exposures to the silicon precursor (operation 112) and the oxidizing agent (operation 116) occur at the same temperature. In some embodiments, the substrate is maintained at a temperature in a range of about 200° C. to about 600° C., or in the range of about 350° C. to about 400° C.

In some embodiments, exposure to the silicon precursor (operation 112) occurs at a different temperature than the exposure to the oxidizing agent (operation 116). In some embodiments, the substrate is maintained at a first temperature in a range of about 300° C. to about 600° C. for the exposure to the silicon precursor, and at a second temperature in the range of about 200° C. to about 600° C. for exposure the oxidizing agent.

In one or more embodiments, the silicon oxycarbide (SiOC) film has a carbon content of greater than or equal to about 5%, 7.5%, 10%, 12.5 or 15%, on an atomic basis. In some embodiments, the silicon oxycarbide (SiOC) film comprises a carbon content in the range of about 2% to about 30%, or in the range of about 3% to about 25%, or in the range of about 4% to about 20%, on an atomic basis.

In one or more embodiments, the silicon oxycarbonitride (SiOCN) film has a nitrogen content of greater than or equal to about 5%, 7.5%, 10%, 12.5 or 15%, on an atomic basis. In some embodiments, the silicon oxycarbonitride (SiOCN) film comprises a nitrogen content in the range of about 0.1% to about 30%, or in the range of about 3% to about 25%, or in the range of about 4% to about 20%, on an atomic basis.

The deposition operation 110 can be repeated to form one or more of a silicon oxycarbide (SiOC) or silicon oxycarbonitride (SiOCN) film having a predetermined thickness. In some embodiments, the deposition operation 110 is repeated to provide one or more of a silicon oxycarbide (SiOC) or silicon oxycarbonitride (SiOCN) film having a thickness greater than about 0.1 nm, or in the range of about 0.1 nm to about 1000 nm.

In one or more embodiments, the low-k silicon oxycarbide (SiOC) film or silicon oxycarbonitride (SiOCN) film is used as a spacer.

Figure 2:
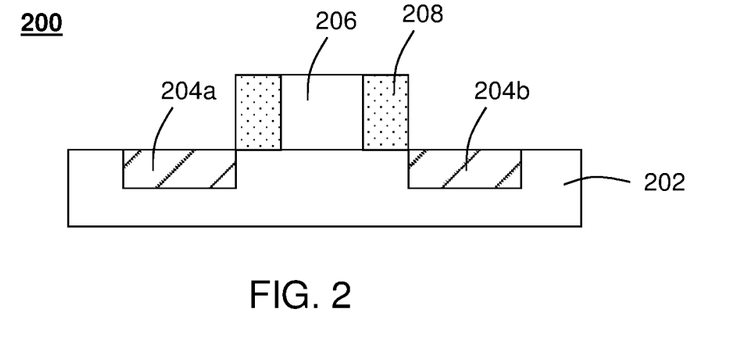
FIG. 2 depicts a cross-sectional view of an electronic device according to one or more embodiments.

FIG. 2 depicts a cross-sectional view of an electronic device according to one or more embodiments. In one or more embodiments, an electronic device 200 is formed. The electronic device 200 may comprise a substrate 202 having an active region with at least one gate stack 206 formed thereon, the at least one gate stack 206 having a first side and a second side. A source material 204a is on the substrate adjacent one of the first side or second side of the at least one gate stack 206. A drain material 204b is on the substrate 202 adjacent the other of the first side or the second side of the at least one gate stack 206. A spacer material 208 on the first side and the second side of the at least one gate stack 206. The spacer material comprises one or more of a silicon oxycarbide (SiOC) or silicon oxycarbonitride (SiOCN) film formed according to one or more embodiments. The silicon oxycarbide (SiOC) and silicon oxycarbonitride (SiOCN) film are substantially free of amorphous carbon. In some embodiments, the space material comprises a structured film with a bilayer or multilayer laminated structure. In such embodiments, one or more of the laminated layers can intentionally be amorphous carbon. Accordingly, in one or more embodiments, the spacer material comprises a multilayer structure comprising an amorphous carbon film and one or more of a silicon oxide film. Using a carbon monoxide (CO) plasma by itself will lead to the deposition of an amorphous carbon film, permitting structured films to be made, for example bilayer SiOx/a-C film that has both excellent electrical properties and WER resistance.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reducing agent). According to one or more embodiments, a purge gas is injected at the exit of the deposition chamber to prevent reactants (e.g., reducing agent) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An electronic device comprising:
    a substrate having an active region with at least one gate stack formed thereon, the at least one gate stack having a first side and a second side;
    a source material;
    a drain material; and
    a spacer material on the first side and on the second side of the gate stack, the spacer material comprising one or more of a silicon oxycarbide (SiOC) film and a silicon oxycarbonitride (SiOCN) film, the silicon oxycarbide (SiOC) film and the silicon oxycarbonitride (SiOCN) film substantially free of amorphous carbon.

2. The electronic device of claim 1, wherein the spacer material comprises a multilayer structure comprising an amorphous carbon film and a silicon oxide (SiOx) film.

3. The electronic device of claim 1, wherein the source material is on the substrate adjacent one of the first side or the second side of the at least one gate stack.

4. The electronic device of claim 3, wherein the drain material is on the substrate adjacent the other of the first side or the second side of the at least one gate stack.

5. The electronic device of claim 1, wherein the spacer material has a K-value in a range of about 2.0 to about 6.0.

6. The electronic device of claim 1, wherein the spacer material has a thickness greater than about 0.1 nm.

7. The electronic device of claim 1, wherein the spacer material is formed by:
    depositing a silicon-containing film on the substrate by exposing the substrate in a processing chamber to a silicon precursor having general formula (I)

wherein $R^1$, $R^2$, $R^3$, $R^4$, $R^5$, and $R^6$ are independently selected from hydrogen (H), substituted alkyl, or unsubstituted alkyl;

purging the processing chamber of the silicon precursor;

exposing the silicon-containing film to a mixture of a carbon monoxide (CO) plasma and an argon (Ar) plasma having a CO:Ar ratio of about 100:0 to about 10:90 to form the spacer material; and purging the processing chamber.

* * * * *